US007476109B2

(12) United States Patent
Tsai

(10) Patent No.: US 7,476,109 B2
(45) Date of Patent: Jan. 13, 2009

(54) ELECTRICAL CONNECTOR ASSEMBLED WITH A BONDABLE ELEMENT

(76) Inventor: Chou Hsuan Tsai, 15F, No. 4, Lane 127, Sec. 1, Fu-Hsing Rd., Hsin-Chuang, Taipei Hsien (TW)

( * ) Notice: Subject to any disclaimer, the term of this patent is extended or adjusted under 35 U.S.C. 154(b) by 123 days.

(21) Appl. No.: 11/435,403

(22) Filed: May 16, 2006

(65) Prior Publication Data

US 2006/0264107 A1 Nov. 23, 2006

(51) Int. Cl.
*H05K 1/00* (2006.01)

(52) U.S. Cl. .......................................... 439/83; 439/79

(58) Field of Classification Search .................. 439/78, 439/79, 83, 541.5

See application file for complete search history.

(56) References Cited

U.S. PATENT DOCUMENTS

| | | | | |
|---|---|---|---|---|
| 6,976,855 | B2 * | 12/2005 | Kennedy et al. | 439/83 |
| 7,083,481 | B2 * | 8/2006 | Pereira et al. | 439/876 |
| 7,128,622 | B2 * | 10/2006 | Tsai | 439/874 |
| 7,140,886 | B1 * | 11/2006 | Chen | 439/83 |
| 7,204,729 | B2 * | 4/2007 | Wu | 439/876 |

* cited by examiner

*Primary Examiner*—Khiem Nguyen
(74) *Attorney, Agent, or Firm*—Pro-Techtor Int'l Services

(57) ABSTRACT

An electrical connector includes a plastic base, terminals, a metal member, and a bondable element. The plastic base is formed with a connection port. Each terminal is disposed on the plastic base and has a pin portion extending out of the plastic base. The metal member is fixed to the plastic base. The bondable element can be easily soldered and is assembled with a connection portion of the metal member.

8 Claims, 9 Drawing Sheets

ELECTRICAL CONNECTOR ASSEMBLED WITH A BONDABLE ELEMENT

BACKGROUND OF THE INVENTION

1. Field of the Invention

The invention relates to an electrical connector, and more particularly to an electrical connector assembled with a bondable element.

2. Description of the Related Art

Referring to FIG. 1, a conventional memory card connector includes a plastic base 10 and a metal housing 16. Terminals 13 are disposed on the plastic base 10. The metal housing 16 covers a top side, a rear side and two lateral sides of the plastic base 10 such that an inserting port 12 is formed at a front side thereof. Two sides of a lower edge of the metal housing 16 are formed with two bonding sheets 18. In usage, the bonding sheets 18 are bonded and fixed to a circuit board to be connected.

The prior art has the following drawbacks. That is, the bonding sheet 18 has to be plated with solder such that it can be firmly soldered. However, the bonding sheets 18 are integrally connected to the metal housing 16, so the bonding sheets 18 together with the overall metal housing 16 have to be locally plated with solder, which is inconvenient and greatly increases the cost.

SUMMARY OF THE INVENTION

It is therefore an object of the invention to provide an electrical connector assembled with a bondable element, wherein the bondable element and a metal member may be separated from each other such that the bondable element may be easily processed.

To achieve the above-mentioned object, the invention provides an electrical connector including a plastic base, terminals, a metal member, and a bondable element. The plastic base is formed with a connection port. Each terminal is disposed on the plastic base and has a pin portion extending out of the plastic base. The metal member is fixed to the plastic base. The bondable element can be easily soldered and is assembled with a connection portion of the metal member.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
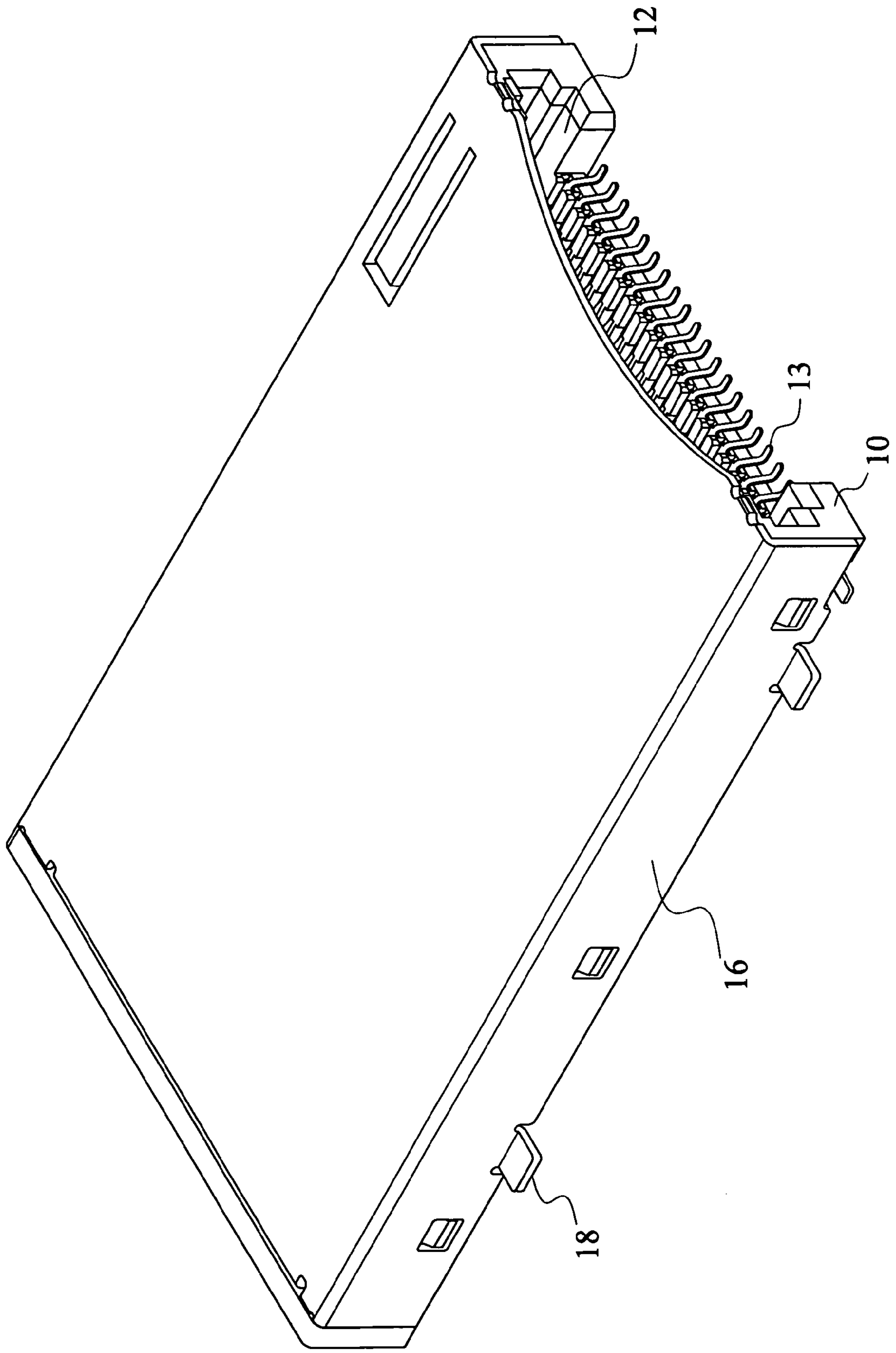
FIG. 1 (Prior Art)
FIG. 1 is a pictorial view showing a conventional electrical connector.
Figure 2:
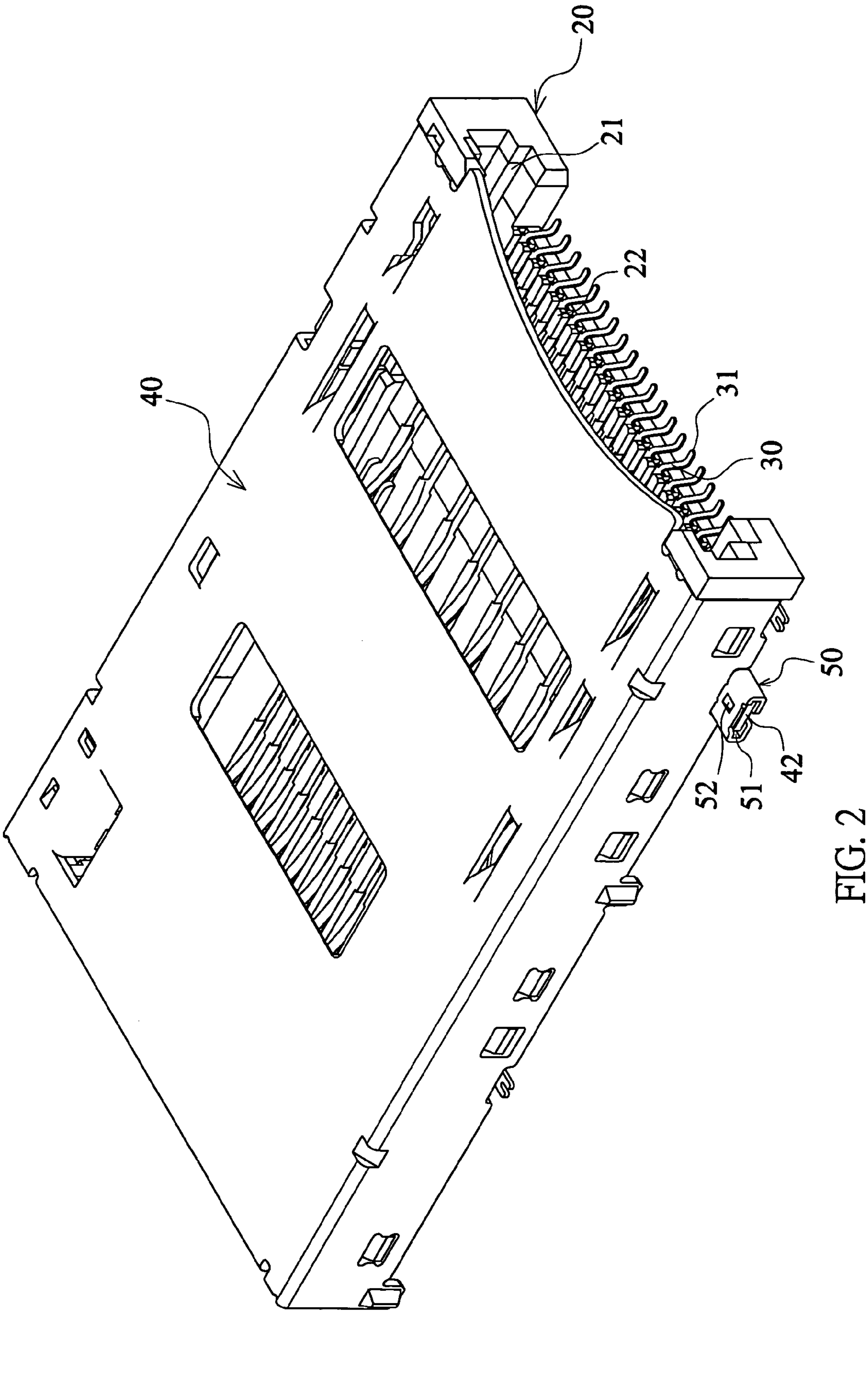
FIG. 2 is a pictorially assembled view showing an electrical connector according to a first embodiment of the invention.
Figure 3:
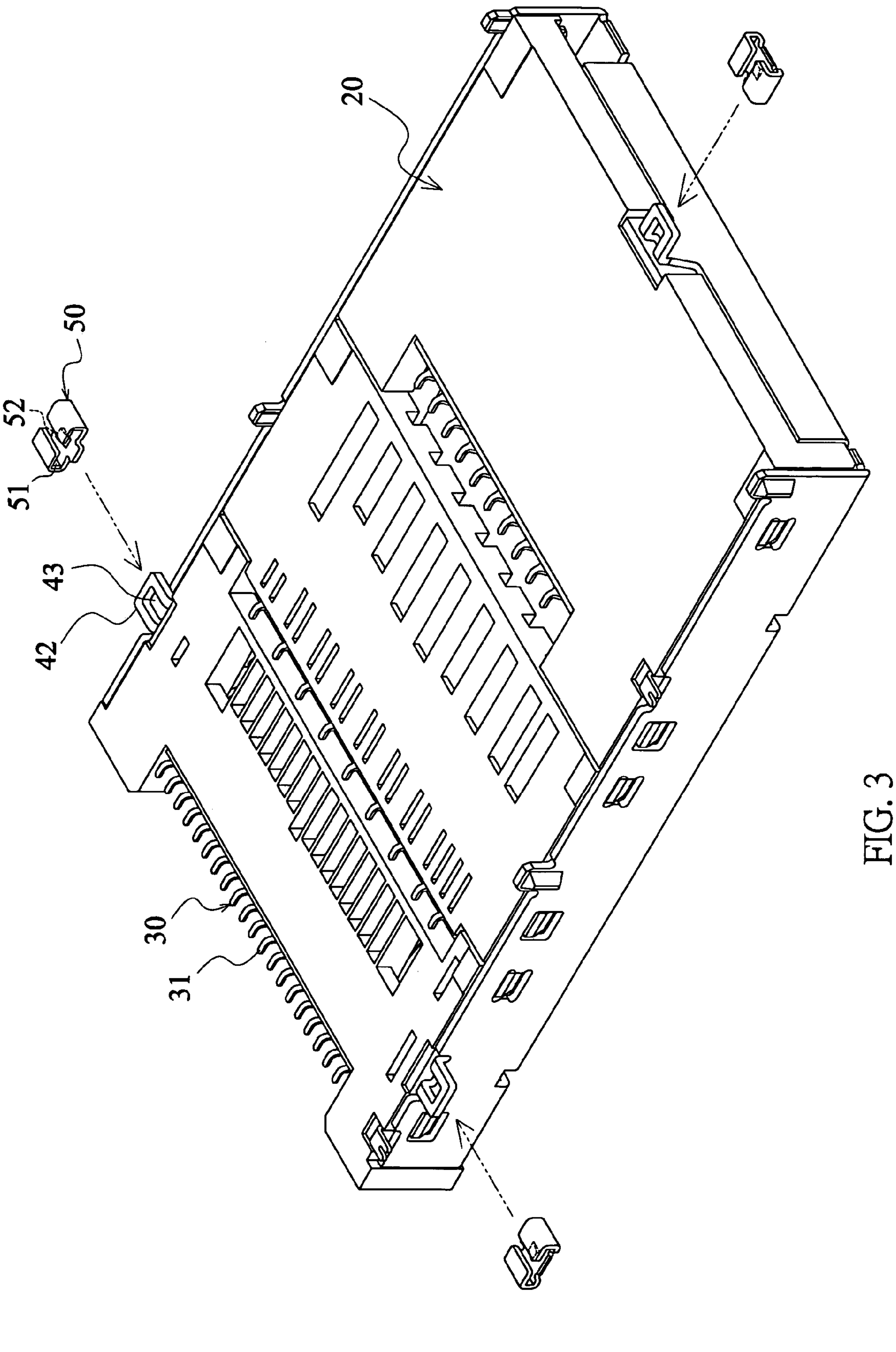
FIG. 3 is a pictorially exploded view showing the inverted electrical connector according to the first embodiment of the invention.

Referring to FIGS. 2 and 3, a memory card connector of the first embodiment includes a plastic base 20, terminals 30, a metal housing 40 and three bondable elements 50.

The plastic base 20 is formed with several slots 21 to be connected to various memory cards with different specifications.

The terminals 30 are arranged on the plastic base 20. Each terminal 30 ha a horizontal pin 31 extending out of the plastic base 20.

The metal housing 40 covers a top side, a rear side and two lateral sides of the plastic base 20 such that a front side of the plastic base 20 is formed with an inserting port 22. A lower edge of the metal housing 40 is formed with three connection portions 42, each of which is a horizontal tab formed with an engagement hole 43.

The bondable element 50 is formed by pressing a copper member or a metal member and is then plated with solder. The bondable element 50 is formed with a fitting slot 51, which is pressed to form a projecting elastic engaging sheet 52. When the fitting slot 51 of the bondable element 50 is fitted with the connection portion 42 of the metal housing 40, the elastic engaging sheet 52 bounces to engage with the engagement hole 43 of the connection portion 42.

According to the above-mentioned structure, the three bondable elements 50 and the pins 31 of the terminals 30 are located on the same plane after the fitting slot 51 of the bondable element 50 is fitted with the connection portion 42 of the metal housing 40. Thus, the elements 50 and the pins 31 may be bonded to a circuit board by way of surface mount technology (SMT).

The invention has the following advantages. The bondable element 50 and the metal housing 40 are not integrally formed but are manufactured separately and then assembled with each other. Thus, the bondable element 50 can be plated with solder independently in an easier manner, and the manufacturing cost can be greatly reduced.

Figure 4:
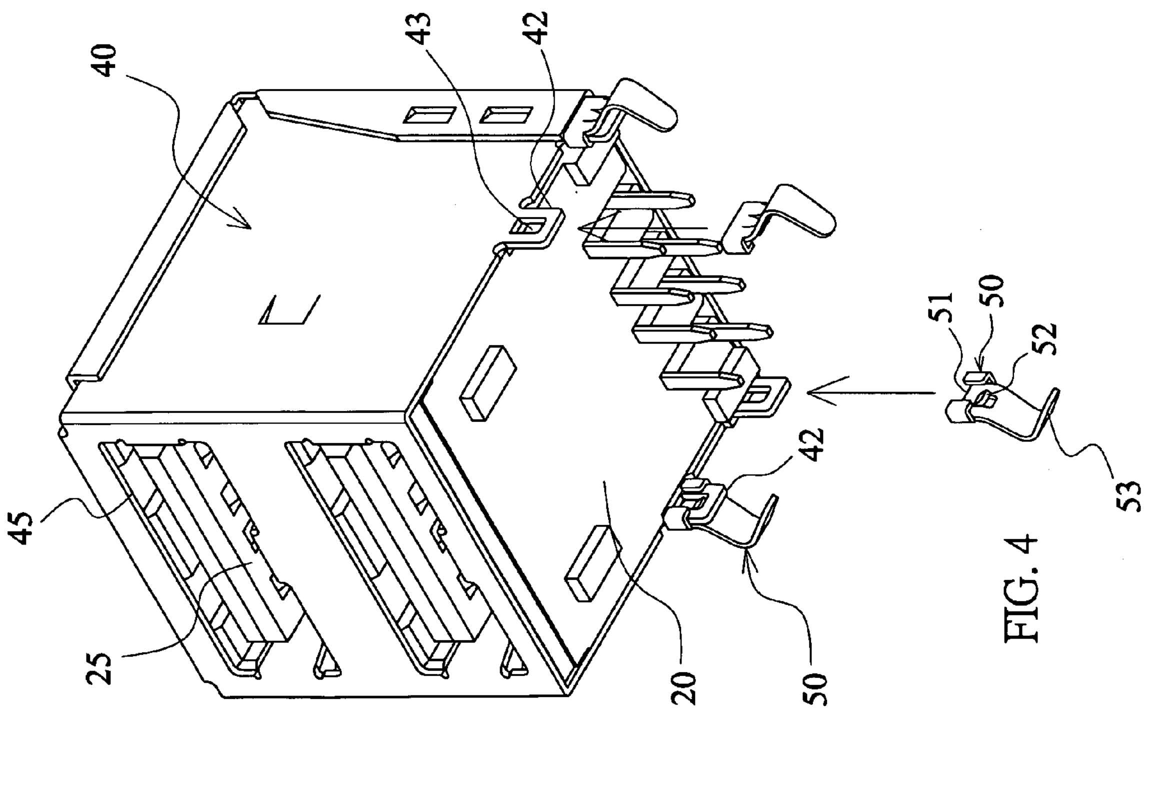
FIG. 4 is a pictorially exploded view showing an electrical connector according to a second embodiment of the invention.

Referring to FIG. 4, a dual-layer USB connector to be connected to universal serial bus (USB) plugs according to a second embodiment of the invention includes a plastic base 20, terminals 30, a metal housing 40 and four bondable elements 50.

The plastic base 20 is formed with two connection ports 25 to be connected to two USB plugs.

The terminals 30 are disposed on the plastic base 20. Each terminal 30 has a longitudinal pin 31 extending out of the plastic base 20.

The metal housing 40 covers a top side, a rear side, a front side and two sides of the plastic base 20 such that the front side of the metal housing 40 is formed with two openings 45, through which the connection ports 25 of the plastic base 20 are exposed. The lower edge of the metal housing 40 is formed with four connection portions 42, each of which is a longitudinal tab formed with an engagement hole 43.

The bondable element 50 is formed by pressing a copper member or a metal member and then plating the pressed member with solder. The bondable element 50 is formed with a fitting slot 51, an elastic hook 53 and a projecting elastic engaging sheet 52 pressed into the fitting slot 51. When the fitting slot 51 of the bondable element 50 is fitted with the connection portion 42 of the metal housing 40, the elastic engaging sheet 52 bounces to engage with the engagement hole 43 of the connection portion 42.

Figure 5:
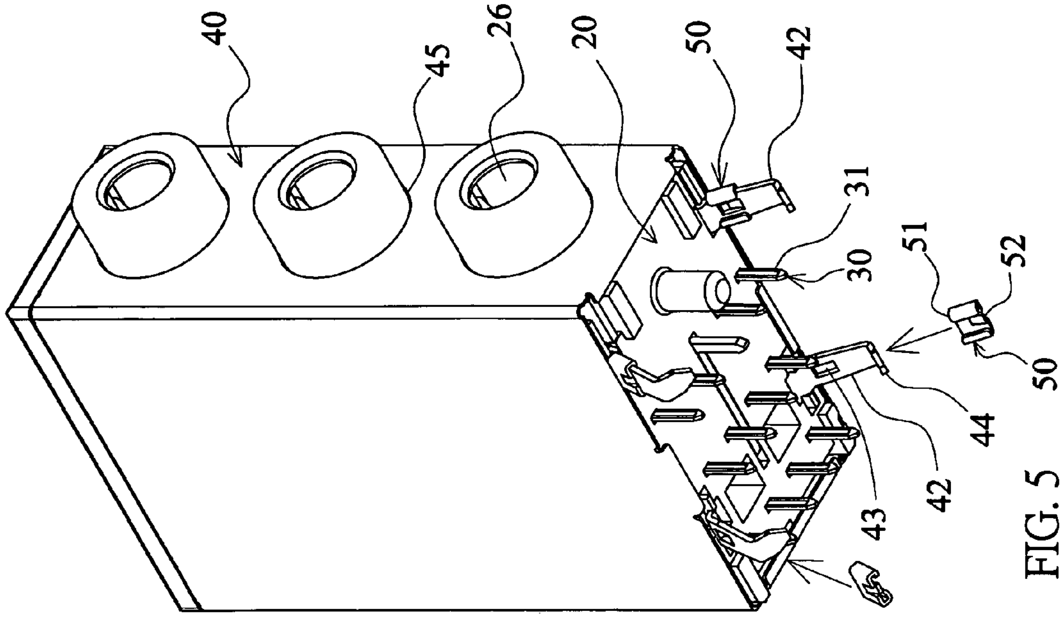
FIG. 5 is a pictorially exploded view showing an electrical connector according to a third embodiment of the invention.

Referring to FIG. 5, a multi-jack connector according to the third embodiment of the invention includes a plastic base 20, terminals 30, a metal housing 40 and four bondable elements 50.

The plastic base 20 is formed with three connection holes 26 to be connected to three plugs with earphone lines or speaker lines.

The terminals 30 are disposed on the plastic base 20. Each terminal 30 has a longitudinal pin 31 extending out of the plastic base.

The metal housing 40 covers a top side, a front side, a rear side and two lateral sides of the plastic base 20 such that the front side of the metal housing 40 is formed with three openings 45, through which the three connection holes 26 of the plastic base 20 are exposed. The lower edge of the metal housing 40 is formed with four connection portions 42, each of which is a longitudinal tab formed with an engagement hole 43. In addition, the bottom of the connection portion is bent to form an elastic hook 44.

The bondable element 50 is formed by pressing a copper member or a metal member and then plating the pressed member with solder. The bondable element 50 is formed with a fitting slot 51 and a projecting elastic engaging sheet 52 pressed into the fitting slot 51. When the fitting slot 51 of the bondable element 50 is fitted with the connection portion 42 of the metal housing 40, the elastic engaging sheet 52 bounces to engage with the engagement hole 43 of the connection portion 42.

Figure 6:
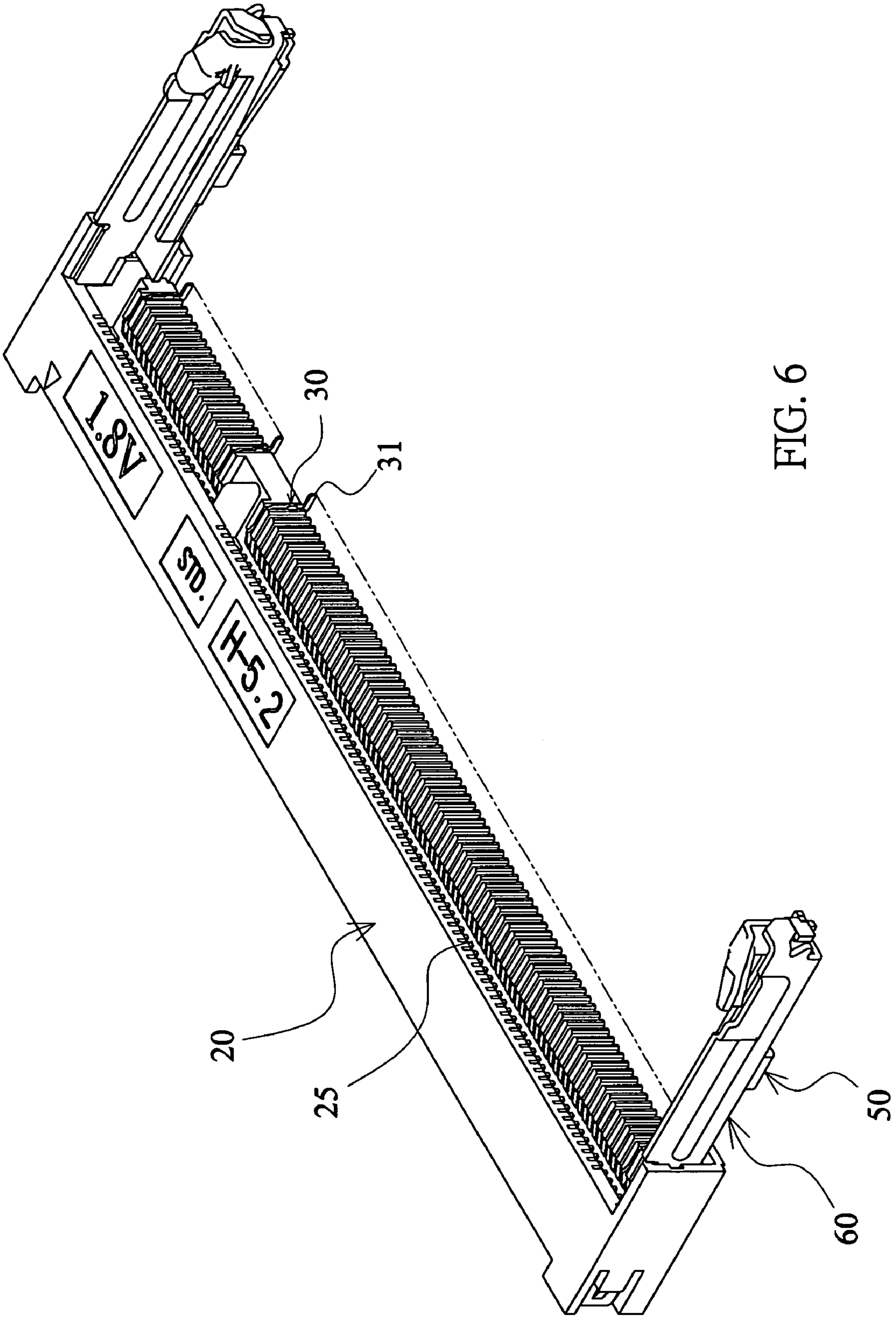
FIG. 6 is a pictorially exploded view showing an electrical connector according to a fourth embodiment of the invention.
Figure 7:
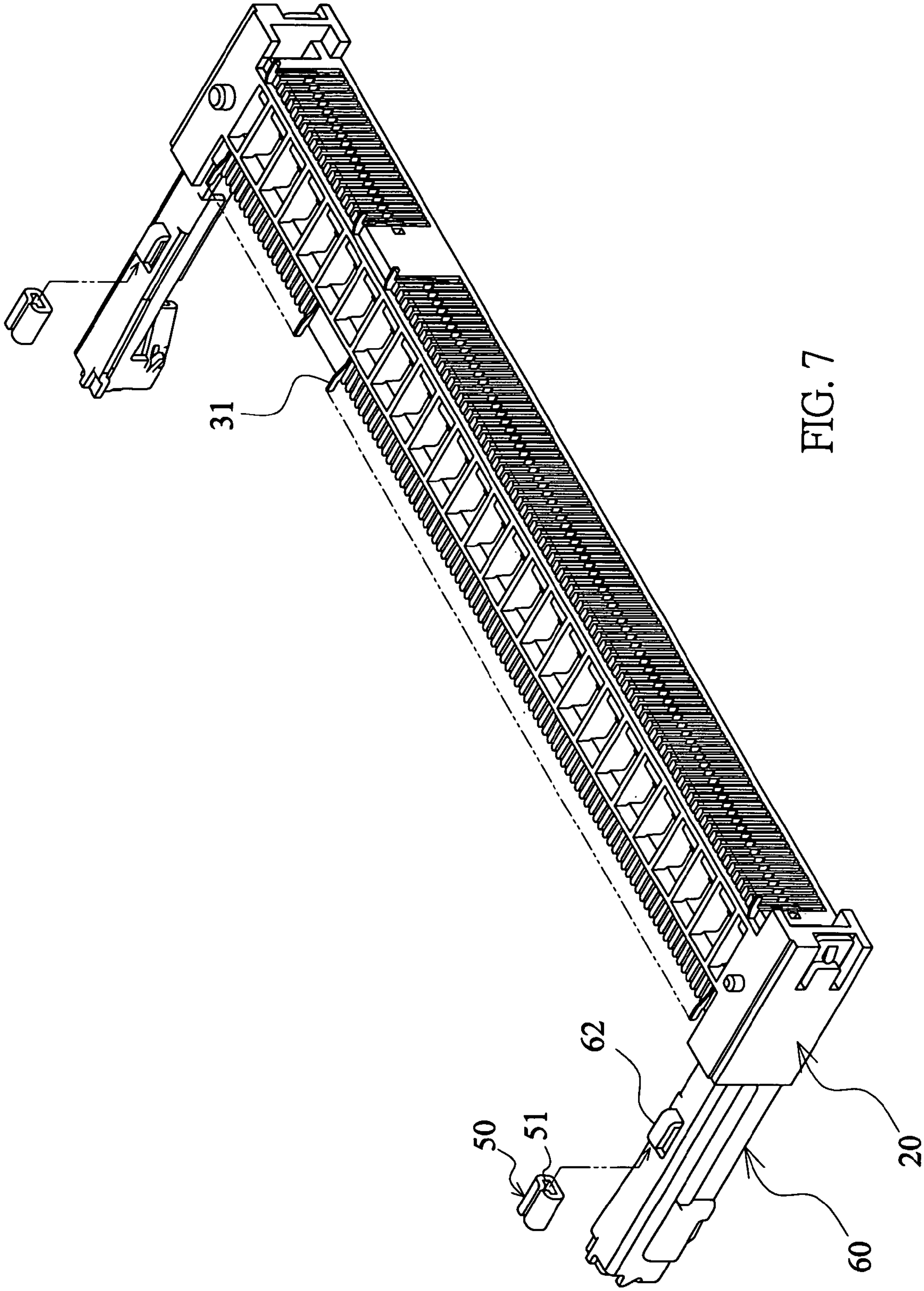
FIG. 7 is a pictorially exploded view showing the inverted electrical connector according to the fourth embodiment of the invention.

Referring to FIGS. 6 and 7, a circuit board connector according to the fourth embodiment of the invention includes a plastic base 20, terminals 30, two metal lugs 60 and two bondable elements 50. The plastic base 20 is formed with a connection portion 25 to be connected to a circuit board.

The terminals 30 are disposed on the plastic base 20. Each of the terminals 30 has a horizontal pin 31 extending out of the plastic base 20.

The metal lugs 60 are assembled and fixed at two sides of the plastic base 20 to form an inverse-U shape together with the plastic base 20. The lower edge of each of two metal lugs 60 is formed with a connection portion 62, which is a horizontal tab.

The bondable element 50 is formed by pressing a copper member or a metal member and then plating the pressed member with solder. The bondable element 50 is formed with a fitting slot 51 fitted with and tightly fixed to the metal lug 60.

Figure 8:
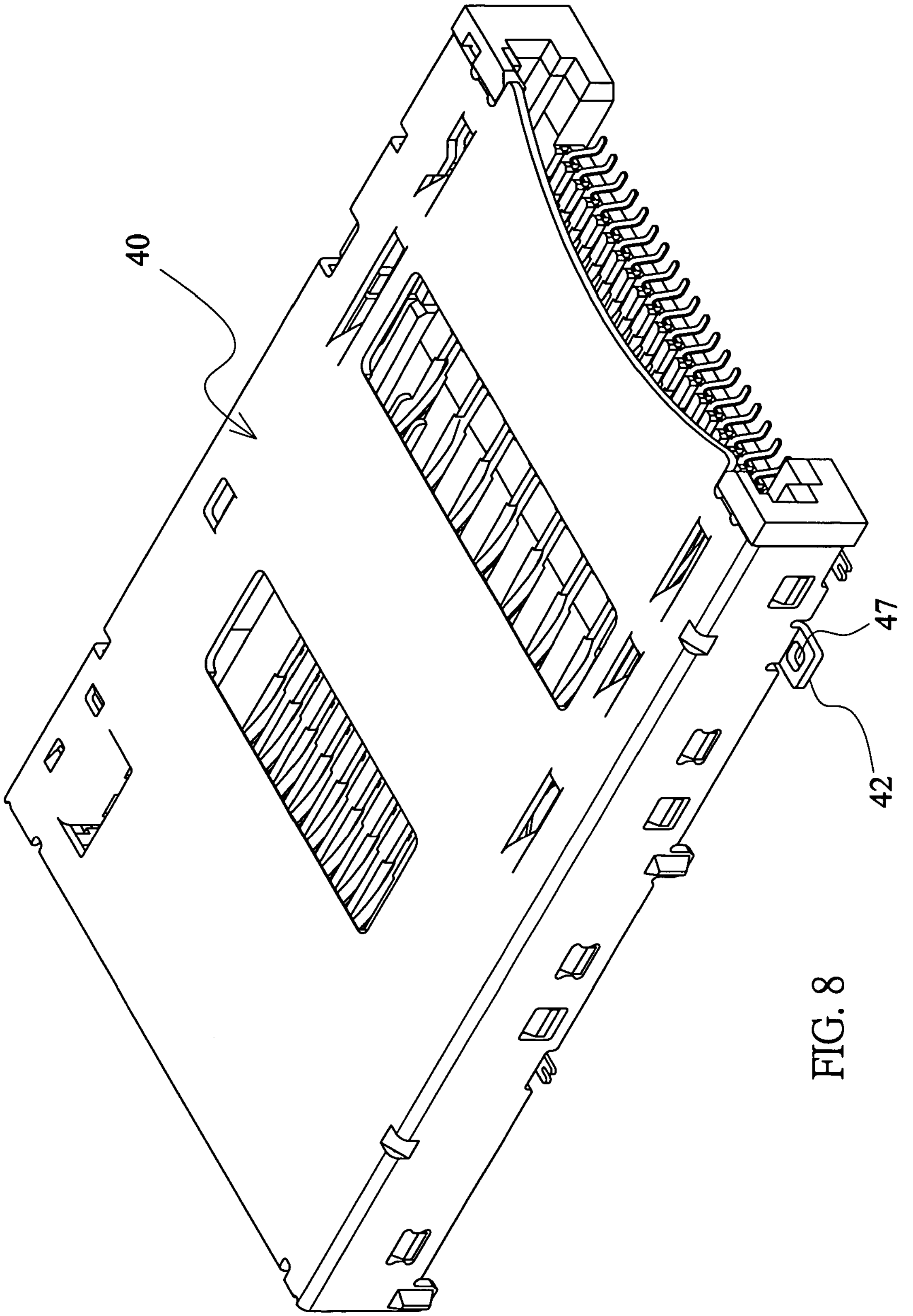
FIG. 8 is a pictorial view showing a bondable element, which has not been assembled yet, according to a fifth embodiment of the invention.
Figure 10:
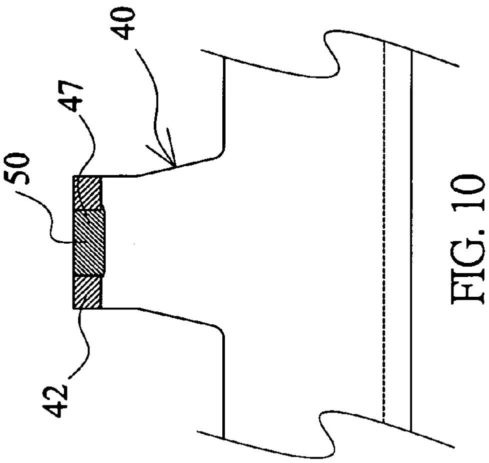
FIG. 10 is a cross-sectional view showing the metal housing assembled with the bondable element according to the fifth embodiment of the invention.
Figure 9:
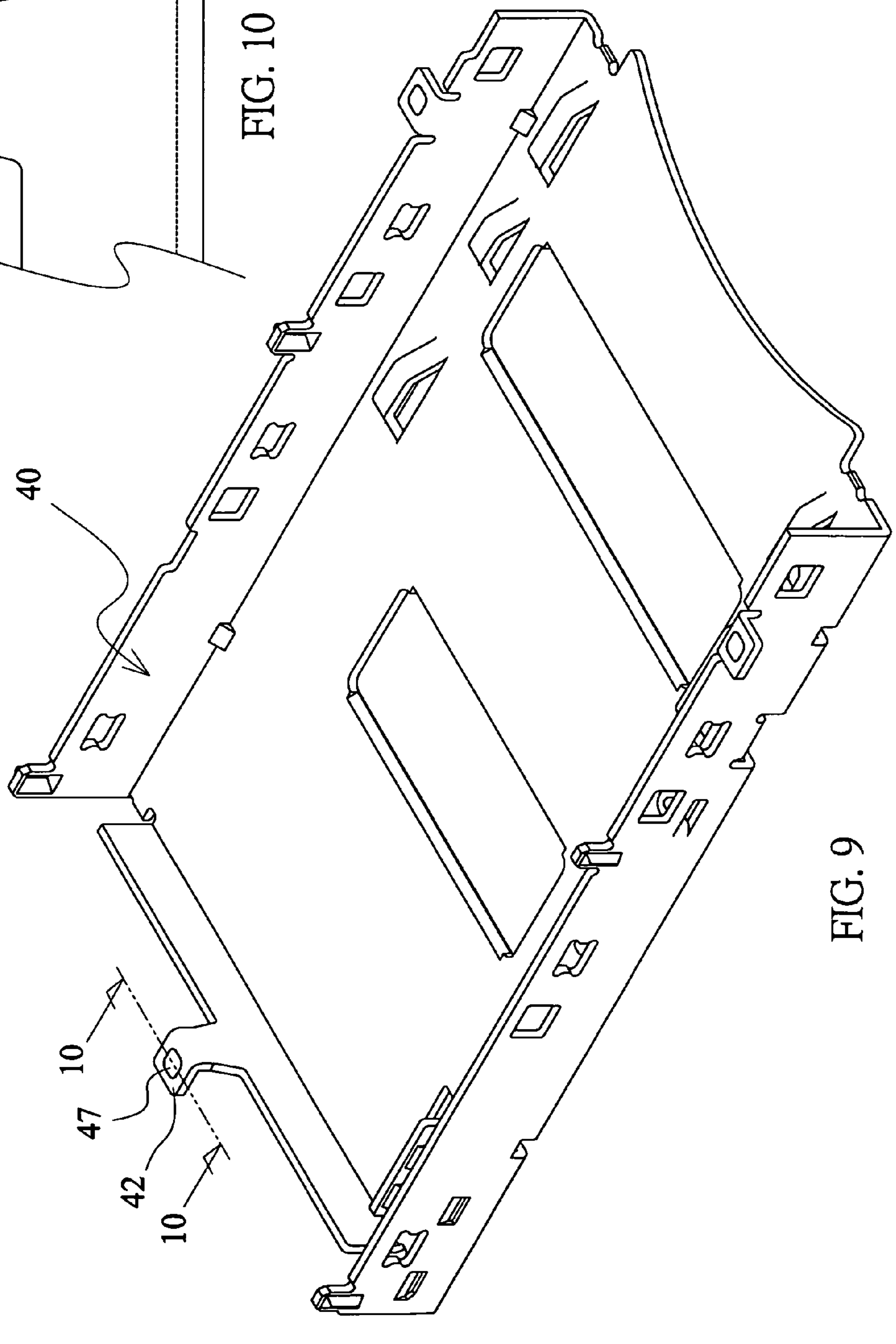
FIG. 9 is a pictorial view showing a metal housing assembled with the bondable element according to the fifth embodiment of the invention.

Referring to FIGS. 8 to 10, the memory card connector according to the fifth embodiment of the invention is almost the same as the first embodiment except that the connection portion 42 of the metal housing 40 is formed with a through hole 47, and the bondable element 50 is a solder ball, which is pressed and deforms to fill the through hole 47.

Figure 11:
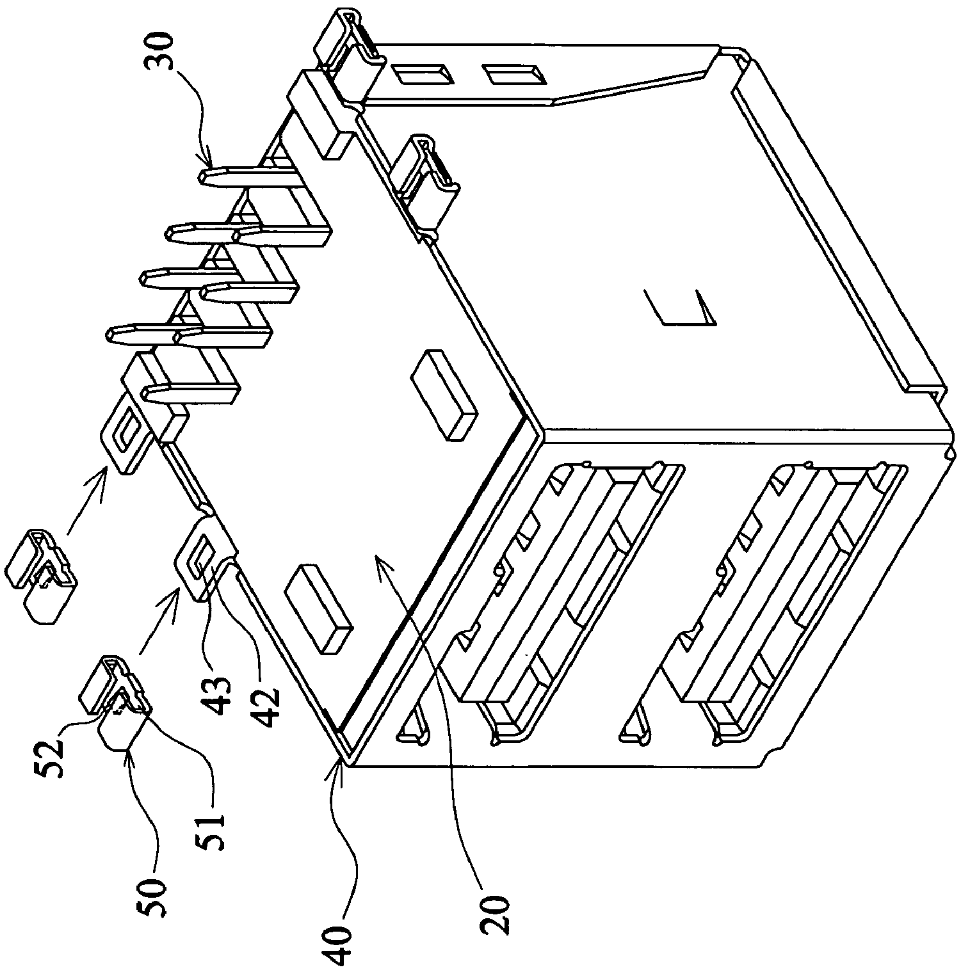
FIG. 11 is a pictorially exploded view showing an electrical connector according to a sixth embodiment of the invention.

Referring to FIG. 11, the dual-layer USB connector according to the sixth embodiment of the invention is almost the same as the second embodiment except that the connection portion 42 of the metal housing 40 is a horizontal tab formed with an engagement hole 43. The bondable element 50 is completely the same as that of the first embodiment. Thus, the bondable element 50 is formed with a fitting slot 51 and an elastic engaging sheet 52. When the fitting slot 51 of the bondable element 50 is fitted with the connection portion 42 of the metal housing 40, the elastic engaging sheet 52 bounces to engage with the engagement hole 43 of the connection portion 42.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical connector, comprising:

a plastic base formed with at least one connection port;

a plurality of terminals disposed on the plastic base, each of the terminals having a pin portion extending out of the plastic base;

a metal member fixed to the plastic base; and a bondable element, which can be easily soldered and is assembled with a connection portion of the metal member, wherein the pin portions and the bondable element are located on the same plane.

2. The connector according to claim 1, wherein the metal member is a metal housing for covering the plastic base, the connection portion is a horizontal tab, and the bondable element is formed with a fitting slot to be fitted with the connection portion of the metal housing.

3. The connector according to claim 2, wherein the connection portion of the metal housing is formed with an engagement hole, the fitting slot of the bondable element is pressed to form a projecting elastic engaging sheet, and the elastic engaging sheet bounces to engage with the engagement hole of the connection portion when the fitting slot of the bondable element is fitted with the connection portion of the metal housing.

4. The connector according to claim 1, wherein the metal member is a metal housing for covering the plastic base, the connection portion is a longitudinal tab, the bondable element is formed with a fitting slot and an elastic hook, and the fitting slot is fitted with the connection portion of the metal housing.

5. The connector according to claim 4, wherein the connection portion of the metal housing is formed with an engagement hole, the fitting slot of the bondable element is pressed to form a projecting elastic engaging sheet, and the elastic engaging sheet bounces to engage with the engagement hole of the connection portion when the fitting slot of the bondable element is fitted with the connection portion of the metal housing.

6. The connector according to claim 1, wherein the connection portion of the metal member is a horizontal tab formed with a through hole, and the bondable element is a solder ball, which is pressed and deforms to fill the through hole.

7. The connector according to claim 1, wherein the metal member comprises two metal lugs fixed to two sides of the plastic base, the connection portion is a horizontal tab, the bondable element is formed with a fitting slot, and the fitting slot is fitted with the connection portion of the metal lug.

8. The connector according to claim 1, wherein the bondable element comprises a copper member or a metal member, which is formed by way of pressing and is then plated with solder.

* * * * *